(12) United States Patent
Sholl et al.

(10) Patent No.: US 7,696,744 B2
(45) Date of Patent: Apr. 13, 2010

(54) SCREW-LESS LATCHING SYSTEM FOR SECURING LOAD BOARDS

(75) Inventors: Todd James Sholl, San Jose, CA (US); Noriyuki Sugihara, Campbell, CA (US); Sanjeev Grover, San Jose, CA (US); Stephen Bellato, Martinez, CA (US); Benson Morris, Santa Cruz, CA (US)

(73) Assignee: Verigy(Singapore) Pte. Ltd., Singapore (SG)

( * ) Notice: Subject to any disclaimer, the term of this patent is extended or adjusted under 35 U.S.C. 154(b) by 273 days.

(21) Appl. No.: 11/998,614

(22) Filed: Nov. 29, 2007

(65) Prior Publication Data

US 2009/0141463 A1    Jun. 4, 2009

(51) Int. Cl.
*G01R 31/00*    (2006.01)
*G06F 1/16*    (2006.01)

(52) U.S. Cl. .................................... 324/158.1

(58) Field of Classification Search ........................ None
See application file for complete search history.

(56) References Cited

U.S. PATENT DOCUMENTS

| | | | | |
|---|---|---|---|---|
| 4,329,642 A * | 5/1982 | Luthi et al. | .................. | 324/755 |
| 6,504,389 B1 * | 1/2003 | Hembree | ..................... | 324/755 |
| 6,818,128 B2 * | 11/2004 | Minter | ........................ | 210/205 |
| 6,927,588 B1 * | 8/2005 | Snelgrove | ................... | 324/755 |

* cited by examiner

Primary Examiner—Vinh P Nguyen
(74) Attorney, Agent, or Firm—Fay Kaplun & Marcin, LLP (57) ABSTRACT

A screw-less latching system for securing load boards comprises a frame and a backer plate. The frame includes a loading site for a device under test. The loading site includes a first tee clamp disposed along a first longitudinal axis and a second tee clamp disposed along a second longitudinal axis of the loading site. The loading site further includes a first spring plunger disposed along a first lateral axis of the loading site. The backer plate is configured to attach the device under test. The backer plate includes two lock tabs coupling with the first and second tee clamps. The backer plate further includes a first recess coupling with the first spring plunger.

20 Claims, 12 Drawing Sheets

SCREW-LESS LATCHING SYSTEM FOR SECURING LOAD BOARDS

BACKGROUND

A newly manufactured electronic device is tested to create stimulus signals and capture responses. These measurements may be used to, for example, measure actual performance against expected performance. The expected performance may be performance metrics defined by a manufacturer, an industry standard, etc. For example, an electronic device which purports to be compliant with the Peripheral Component Interconnect-Express (PCI-Express) specification must meet the performance metrics defined therein. The proper operation of the electronic devices may then be proven or faults in the devices may be traced and repaired.

One mode of testing electronic devices is to utilize a frame so that multiple newly manufactured electronic devices may be tested concurrently. For example, a load board may be the newly manufactured device that is tested. The load board may couple to a portion of the frame while another load board couples to a different portion of the frame. Coupling as many load boards allowed by the frame offers a more efficient testing of newly manufactured electronic devices. However, the load boards must be held in place while a test is conducted. To securely attach the load board to the frame, screws are used. As many as 51 screws are necessary to attach the load board to the frame. Individually securing and releasing the load board decreases the efficiency in which continual tests may be conducted on multiple newly manufactured electronic devices. Furthermore, the screws are prone to stripping causing removal issues.

SUMMARY OF THE INVENTION

The present invention relates to a screw-less latching system for securing load boards. The system comprises a frame and a backer plate. The frame includes a loading site for a device under test. The loading site includes a first tee clamp disposed along a first longitudinal axis and a second tee clamp disposed along a second longitudinal axis of the loading site. The loading site further includes a first spring plunger disposed along a first lateral axis of the loading site. The backer plate is configured to attach the device under test. The backer plate includes two lock tabs coupling with the first and second tee clamps. The backer plate further includes a first recess coupling with the first spring plunger.

DESCRIPTION OF THE DRAWINGS

FIG. 4b shows an assembled view of the tee clamp of FIG. 4a.

FIG. 5 shows perspective view of an assembled frame including the spacer frame of FIG. 2 with a plurality of tee clamps of FIG. 4a.

FIG. 6b shows a perspective view of a bottom side of the backer plate of FIG. 6a.

FIG. 7 shows a perspective view of a first exemplary step for coupling the assembled frame of FIG. 5 with the backer plate of FIG. 6a.

FIG. 8 shows a perspective view of a second exemplary step for coupling the assembled frame of FIG. 5 with the backer plate of FIG. 6a.

FIG. 9 shows a perspective view of the assembled frame of FIG. 5 coupled to the backer plate of FIG. 6a.

FIG. 11 shows the tee clamp of FIG. 4b coupled to a lock tab of the backer plate of FIG. 6a.

DETAILED DESCRIPTION

The exemplary embodiments of the present invention may be further understood with reference to the following description and the appended drawings, wherein like elements are referred to with the same reference numerals. The exemplary embodiments of the present invention provide a system for performing an electronic test on an electronic device. Furthermore, the exemplary system may perform an electronic test on multiple electronic devices concurrently. The exemplary system allows a user to efficiently secure and release electronic devices for testing. The exemplary embodiments of the present invention will be described with reference to a system utilizing a slide-and-lock latching scheme. The latching scheme will be described in detail below.

Figure 1:
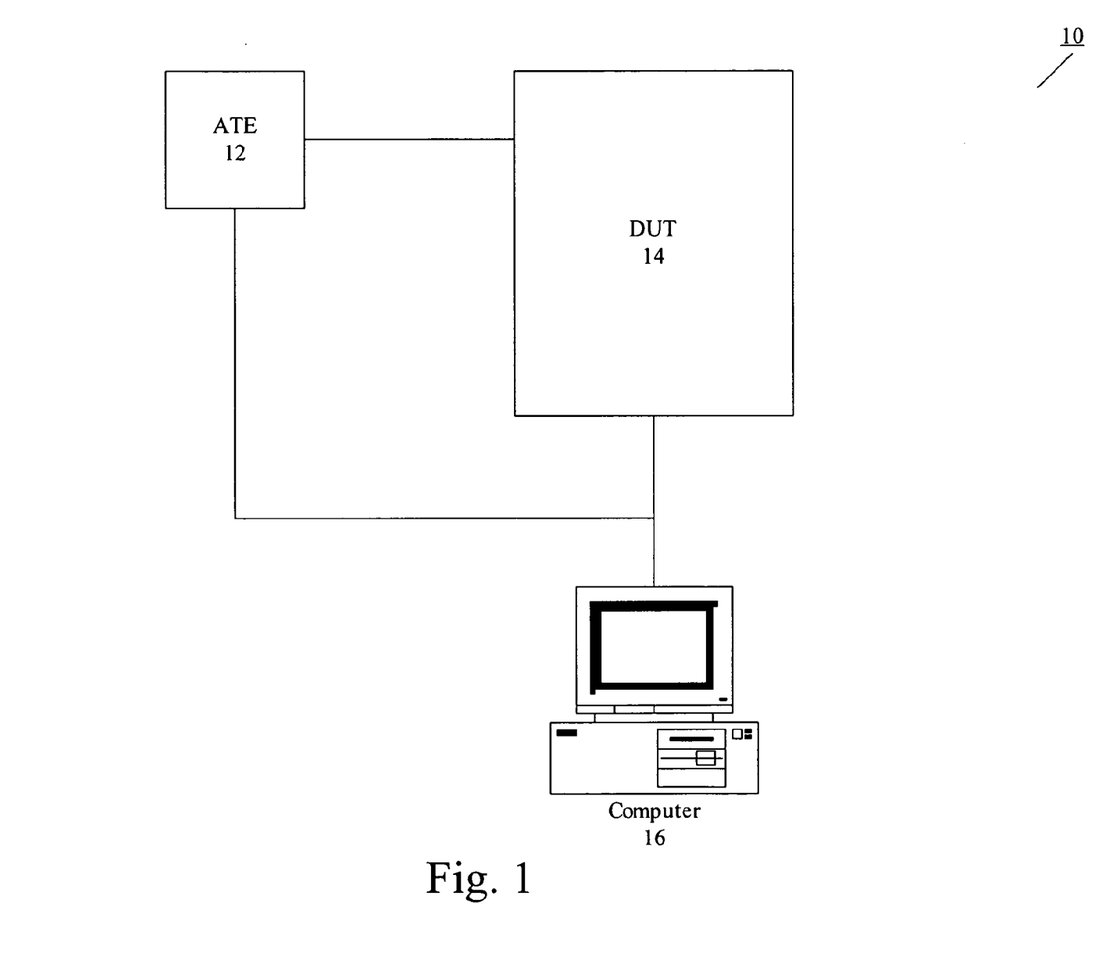
FIG. 1 shows a testing system according to an exemplary embodiment of the present invention.

FIG. 1 shows a testing system 10 according to an exemplary embodiment of the present invention. The system 10 may be for performing a test on an electronic device. The test may be for various types of electronic devices (e.g., a DRAM device, an SDRAM device, etc.) and may, therefore, include the various tests performed for the specific type of electronic device. For example, with memory devices, a frequency offset test may be performed to determine if the memory device is compliant with at least one of the performance metrics defined in, for example, the PCI-Express specification, Institute of Electrical and Electronics Engineers (IEEE) standards, etc. The exemplary embodiments of the present invention incorporate the various tests required for testing the various types of electronic devices.

The system 10 includes an automatic test equipment (ATE) device 12 which is electrically coupled to a device under test (DUT) 14. The system 10 may further include a computer 16 (e.g., PC, laptop, tablet, etc.) which is coupled to the DUT 14 and/or the ATE device 12. The computer 16 (or any of the DUT 14 and the ATE device 12) may include a memory storing a set of instructions for implementing the electronic test. The computer 16 may include an output device, e.g., display screen, printer, etc., for outputting results of the electronic test. It should be noted that multiple ATE devices may be electrically coupled to the DUT 14 and further to the computer 16. For example, with frequency offset tests, one ATE device may include transmit and receive lines for data transmission/reception. Another ATE device may include a clock to time the different data transfers.

In the exemplary embodiment, the DUT 14 (i.e., load) may be an electronic device (e.g., video card, sound card, high speed memory device, etc.) which purports to operate in accordance with a test procedure such as a manufacturer specification, a production specification, the PCI-Express specification, IEEE specification, etc. Thus, the DUT 14 may be any device in a consumer electronic or high-end engineering application, such as satellite, data processing, telecommunications, etc. The DUT 14 may implement, for example, a System-on-a-Chip (SoC) or a System-in-a-Package (SIP) architecture. The DUT 14 may also represent a system that includes multiple electronic devices that are under test. For example, the DUT 14 of the system 10 may represent a frame with multiple electronic devices attached thereto. The ATE device 12 may therefore test each of the electronic devices attached to the frame. The results of the test may be stored and/or transmitted to the computer 16.

The ATE device 12 may be SoCs which include a microprocessor, memory and a plurality of application specific integrated circuits (ASICs) implementing a test-per-pin architecture in which each pin of the DUT 14 may be tested independently. For example, the ATE device 12 may be for digital testing channels. The ATE 12 measures parametric performance measurements pertaining to the DUT 14. This data may be transmitted to the computer 16 for storage and/or processing. Those skilled in the art will understand that the testing system 10 is only exemplary and that the present invention may be implemented on any type of testing system or arrangement.

Figure 2:
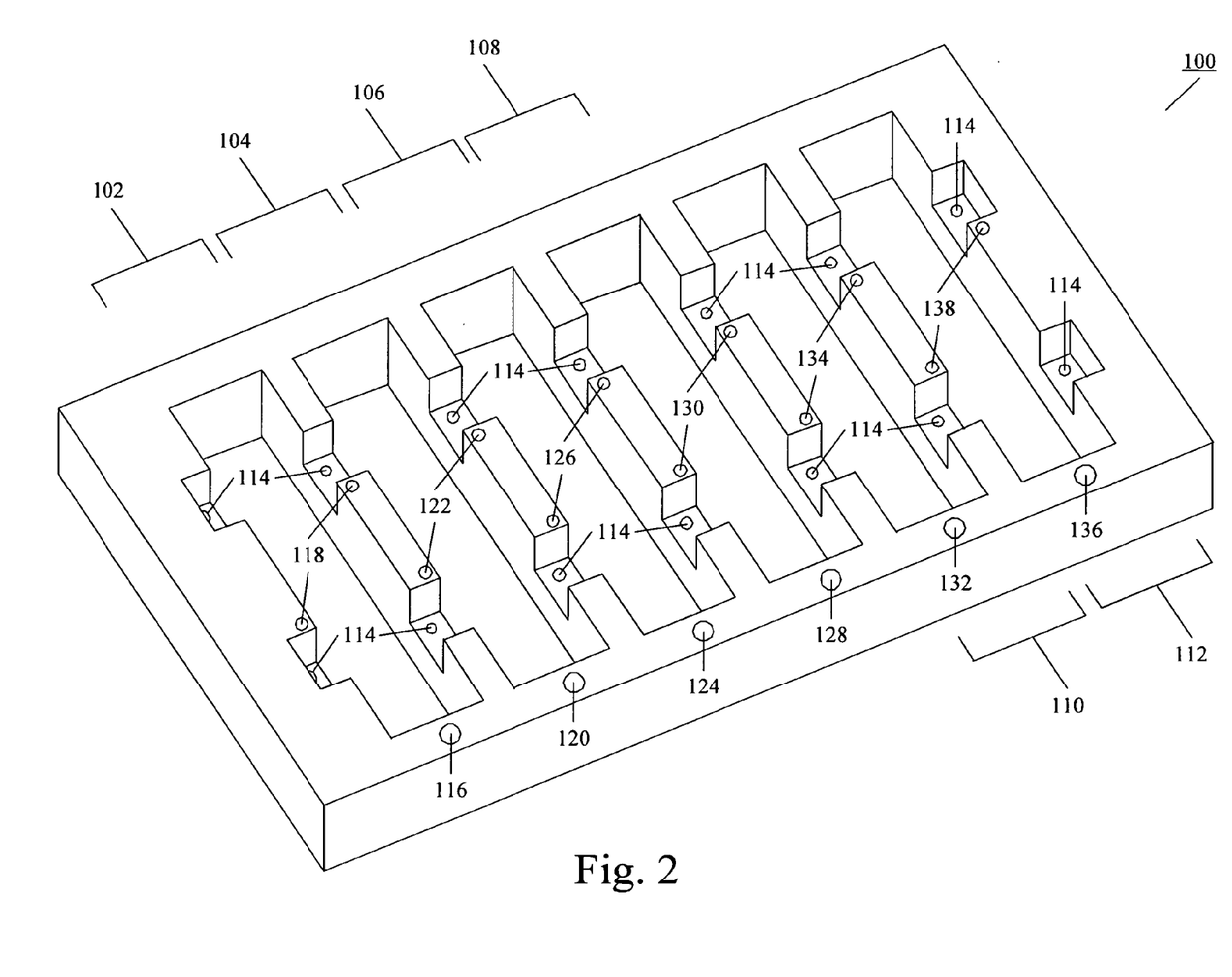
FIG. 2 shows a perspective view of a spacer frame according to an exemplary embodiment of the present invention.

FIG. 2 shows a perspective view of a spacer frame 100 according to an exemplary embodiment of the present invention. The spacer frame 100 may be part of the DUT 14 described above with reference to the testing system 10 of FIG. 1. The spacer frame 100 may allow multiple electronic devices to be attached thereto so that an electronic test may be performed concurrently on the multiple electronic devices. The spacer frame 100 may also be configured to receive testing connectors from the ATE 12. For example, when a DUT is attached to the spacer frame 100, pins or other connecting devices of the DUT may establish an electrical connection to a spacer frame connector. The testing connectors may be received in a port that electrically connects to the spacer frame connector. According to the exemplary embodiment of the spacer frame 100, six load boards may be attached to the spacer frame 100. However, it should be noted that more or fewer than six load boards may be attached to the spacer frame 100.

The spacer frame 100 includes six loading sites 102-112. Each loading site includes an edge spring plunger (ESP) and side spring plungers (SSP). The loading site 102 includes an ESP 116 and SSPs 118. The loading site 104 includes an ESP 120 and SSPs 122. The loading site 106 includes an ESP 124 and SSPs 126. The loading site 108 includes an ESP 128 and SSPs 130. The loading site 110 includes an ESP 132 and SSPs 134. The loading site 112 includes an ESP 136 and SSPs 138. As illustrated, the loading sites 102-112 may exhibit a substantially rectangular shape. However, the loading sites 102-112 may exhibit any shape that corresponds to the electronic device to be tested.

As illustrated, the ESPs 116, 120, 124, 128, 132, 136 may be disposed as a substantially collinear line. The ESPs 116, 120, 124, 128, 132, 136 may be located along a substantially peripheral longitudinal axis of the frame 100. However, with respect to the loading site, the ESPs 116, 120, 134, 128, 132, 136 may be located along a substantially peripheral lateral axis. Furthermore, the longitudinal axis of the frame 100 may be the axis that is further away from screw holes 114. Each of the ESPs 116, 120, 124, 128, 132, 136 may be positioned at a slight distance from a midpoint of a lateral axis of a respective loading site. For example, the ESP 116 may be positioned at midpoints of the lateral axis of the loading site 102. However, it should be noted that positioning the ESPs 116-136 at a midpoint is only exemplary. The ESPs 116, 120, 124, 128, 132, 136 may also be positioned at any point along the lateral axis of the respective loading site.

Furthermore, as illustrated, the SSPs 118, 122, 126, 130, 134, 138 may also be disposed as two substantially collinear lines. The SSPs 118, 122, 126, 130, 134, 138 may be located along a substantially central longitudinal axis of the frame 100. That is, in contrast to the ESPs, the SSPs 118, 122, 126, 130, 134, 138 may be located toward a central longitudinal axis of the frame 100 while the ESPs 116, 120, 124, 128, 132, 136 may be located toward a peripheral longitudinal axis of the frame 100. The SSPs may be positioned along a substantially peripheral longitudinal axis of the loading site. For example, the SSPs 118 may be positioned on both of the longitudinal axes of the loading site 102. Furthermore, the SSPs 118 may be positioned so that they lie on a line that is not parallel to a lateral axis of the loading site 102. That is, the SSPs 118 may be staggered. However, it should be noted that the SSPs 118, 122, 126, 130, 134, 138 may be positioned at any point along the longitudinal axis of the respective loading site. Thus, the SSPs 118, 122, 126, 130, 134, 138 may lie on a line that is parallel to a lateral axis of the respective loading site. Furthermore, it should be noted that the use of two SSPs for each loading site is only exemplary. The frame 100 may utilize any number of SSPs in any configuration for each loading site.

When viewing the frame 100, the loading sites 102-112 may include a window. Between the windows of the loading sites 104-110 may include a separator. The SSPs may be located on these separators. As illustrated, one of the pair of SSPs of a loading site may be disposed on a same separator as one of the pair of SSPs of an adjacent loading site. For example, the SSP 122 and the SSP 126 are disposed on the same separator. The separators may also include recesses. As illustrated, each separator includes a pair of recesses. Each recess extends a partial distance of a longitudinal axis while extending a full distance of a lateral axis of a loading site. Each recess includes the screw hole 114. The recesses and screw holes 114 may lie along a respective longitudinal axis of the frame 100. The loading site 102 and 112 include a side that is not adjacent to another loading site. This side may be towards a lateral edge of the frame 100. These edges also include a pair of recesses and a screw hole 114 in each recess. Furthermore, one of the pair of SSPs are located on these edges. The components and mechanism of the ESPs and SSPs will be described with reference to FIGS. 10a-c.

According to the exemplary embodiments of the present invention, a size of the ESPs and SSPs may be different. Specifically, the ESPs may be larger than the SSPs. As will be explained in detail below, the ESPs serve to prevent a first movement while the SSPs aid in preventing a second movement. Thus, the ESPs may be larger due to the ESPs alone preventing the first movement. In addition, the ESPs may be larger due to more available space in which to dispose the ESPs in contrast to the limited space in which the SSPs are disposed. However, it should be noted that the size of the ESPs and the SSPs being different is only exemplary. For example, the size of the ESPs and the SSPs may be equal. In another example, the size of the SSPs may be greater than the size of the ESPs.

Figure 3:
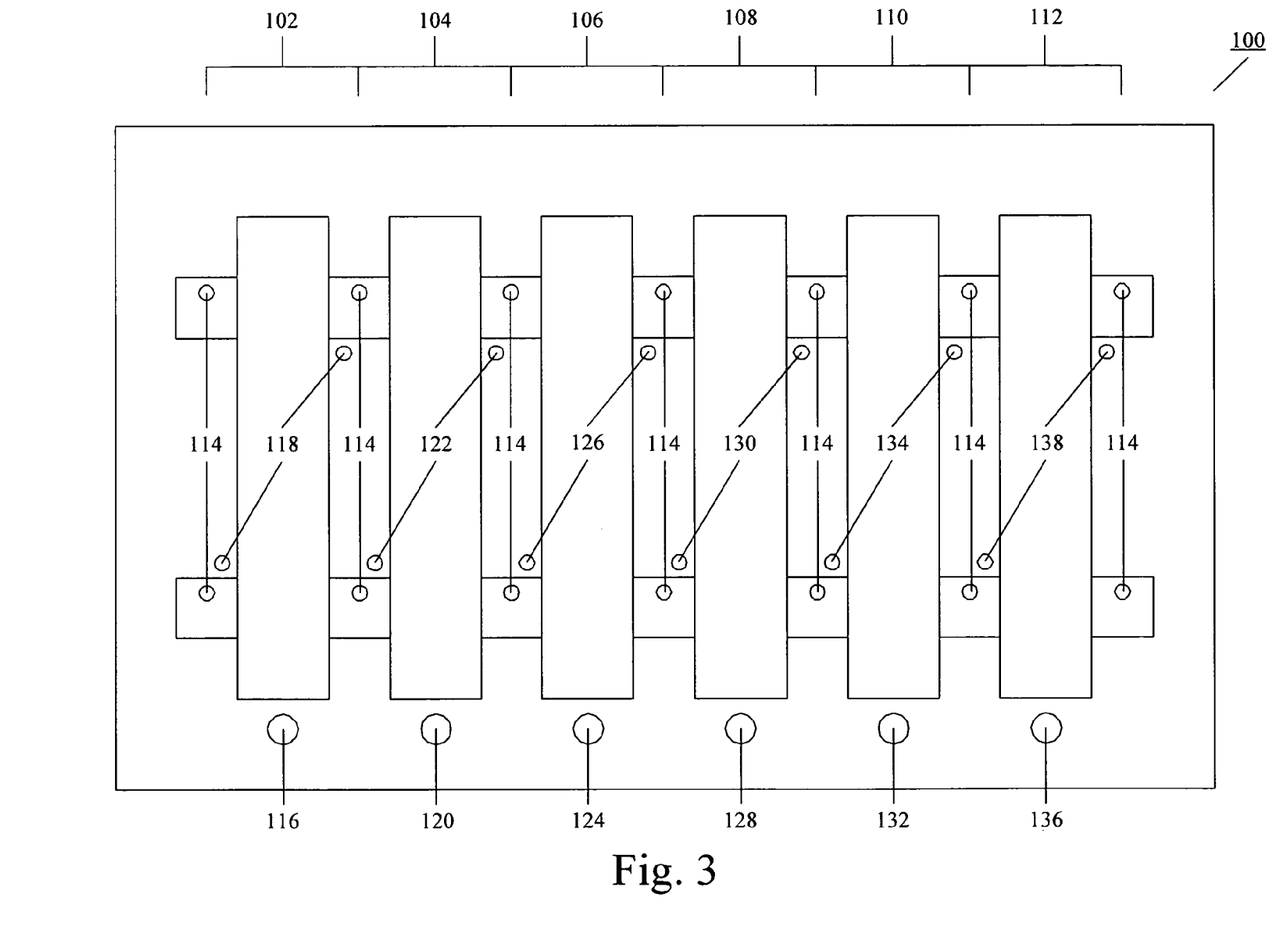
FIG. 3 shows a top view of the spacer frame of FIG. 2.

FIG. 3 shows a top view of the spacer frame 100 of FIG. 2. The top view of the frame 100 illustrates the components described above with reference to FIG. 2. The top view better illustrates spatial orientations of the components of the frame 100. For example, the top view of FIG. 3 illustrates that the ESPs 116, 120, 124, 128, 132, 136 and the SSPs 118, 122, 126, 130, 134, 138 are collinear and lie on a longitudinal axis of the frame 100. Furthermore, the substantially rectangular shape of the windows of the loading sites 102-112 is visible. As described above, the screw holes 114 may be located in a recess. As illustrated, the spatial orientation of the screw holes 114 is visible. For example, each screw hole 114 may be disposed toward a top side of the recess. Furthermore, each screw hole 114 may be disposed along a midline of the recess running parallel to a lateral axis of the frame. The stagger pattern of the SSPs 118, 122, 126, 130, 134, 138 is visible as well.

Figure 4A:
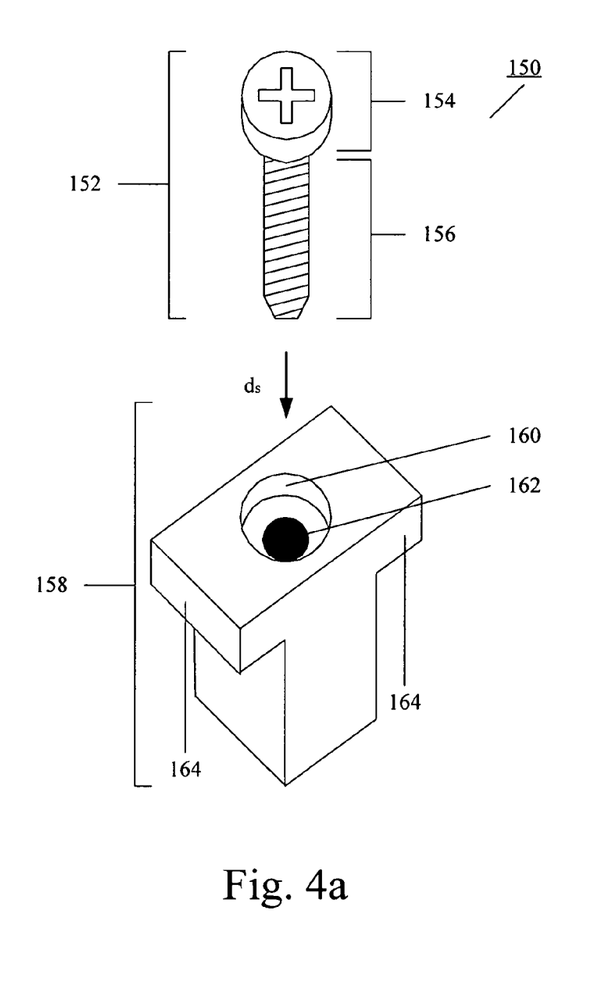
FIG. 4a shows an exploded view of a tee clamp according to an exemplary embodiment of the present invention.

FIG. 4a shows an exploded view of a tee clamp 150 according to an exemplary embodiment of the present invention. The tee clamp 150 attaches to each of the screw holes 114 of the frame 100. As will be described in further detail below, the tee clamp 150 serves as a first mechanism to securely fasten a load board onto the frame 100 for testing purposes. The mechanism in which the tee clamp 150 securely fastens the load board will be discussed in further detail below. The tee clamp 150 includes a screw 152 and a clamp body 158.

The screw 152 may include a screw head 154 and a screw body 156. As illustrated, the screw head 154 may include a Phillips head. However, it should be noted that the screw head 154 may include any type of head for screwing. For example, the screw head 154 may include a straight edge, a pentagonal head, a hexagonal head, an octagonal head, etc. The screw body 156 may be a conventional screw body with a variety of threads (e.g., compactness, length, etc.). The clamp body 158 may include a clamp screw head insert 160, a clamp screw hole 162, and clamp wings 164. The clamp screw head insert 160 may be a recess where at least a portion of the screw head 154 is positioned when the tee clamp 150 is properly assembled. The clamp screw hole 162 may be a recess where the screw body 156 is positioned when the tee clamp 150 is properly assembled. The clamp wings 164 may be extensions along a top side of the clamp body 158, thereby giving the tee clamp 150 a T-shape. The screw 152 may be inserted into the clamp body 158 by being inserted in the direction $d_s$. The screw body 156 may be greater in length than the clamp screw hole 162.

Figure 4B:
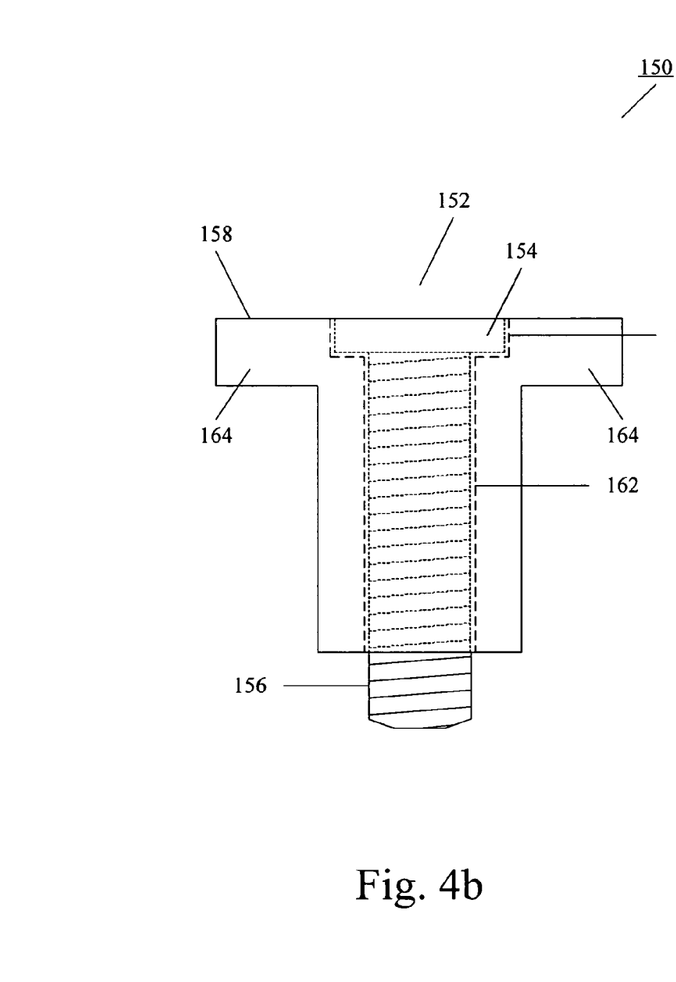

FIG. 4b shows an assembled view of the tee clamp 150 of FIG. 4a. The assembled view of FIG. 4b illustrates the components of the tee clamp 150 described above with reference to FIG. 4a. When the tee clamp 150 is assembled, the screw 152 may be substantially incorporated within the clamp body 158. As described above, the screw 152 may be inserted into the clamp body upon moving in the direction $d_s$. As illustrated, the screw head 154 may be positioned wholly in the clamp screw head insert 160. However, it should be noted that the screw head 154 may be partially outside the clamp body 158. The clamp screw head insert 160 and the clamp screw hole 162 combine to extend a longitudinal length of the clamp body 158. Once the screw 152 is properly positioned to the clamp body 158, the screw body 156 is positioned in the clamp screw hole 162 and extends beyond a bottom side of the clamp body 158. The extended portion of the screw body 156 may be inserted into each of the screw holes 114 of the frame 100, thereby securely attaching the tee clamp 150 to the frame 100. The orientation of the tee clamp 150 with respect to the frame 100 will be described in detail below.

Figure 5:
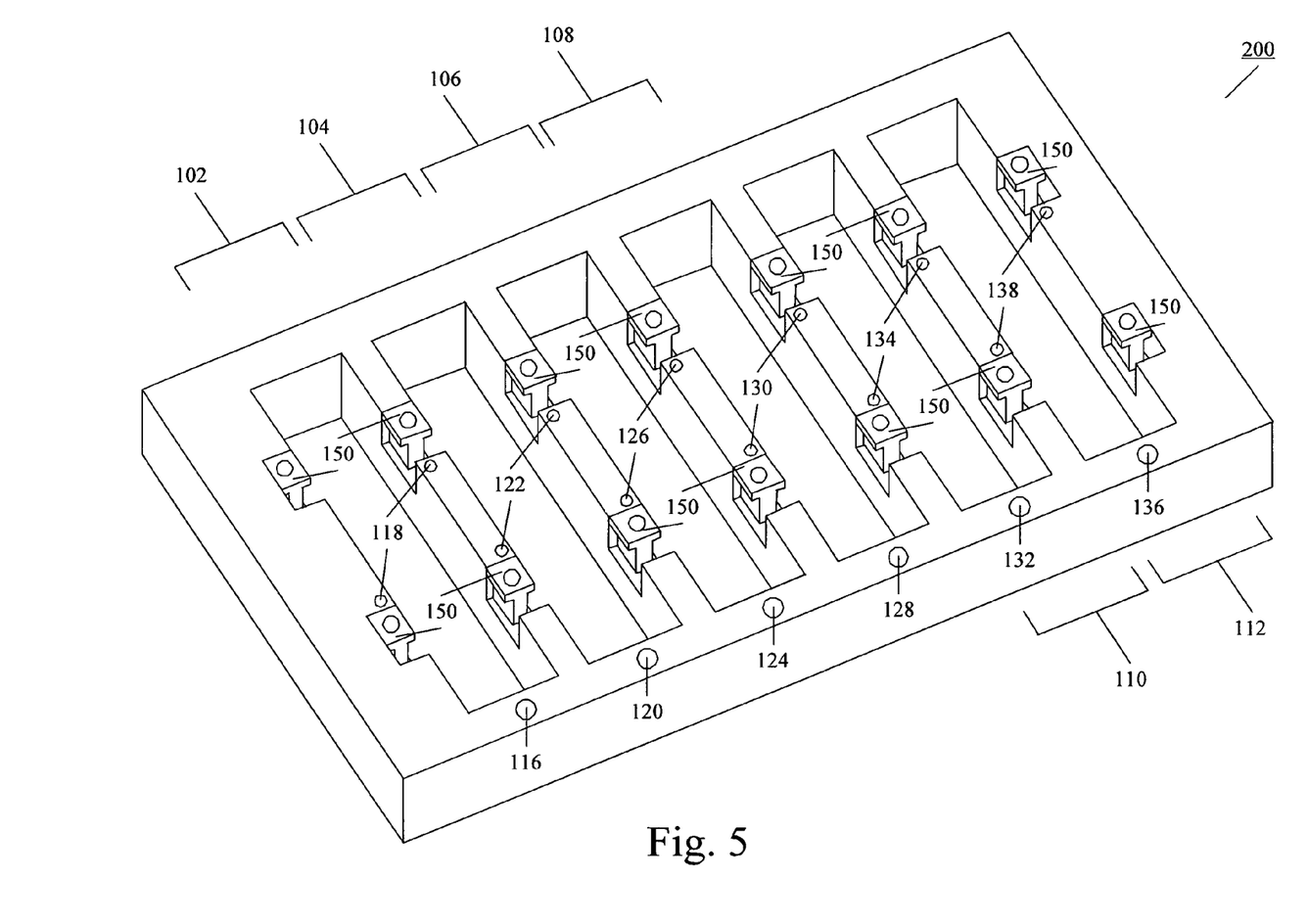

FIG. 5 shows a perspective view of an assembled frame 200 including the spacer frame 100 of FIG. 2 with a plurality of tee clamps 150 of FIG. 4a. The assembled frame 200 may be a completed form prepared to accept a plurality of load boards. As will be described in further detail below, the ESPs 116, 120, 124, 128, 132, 136 may provide a securing of a lateral side of the load board. The SSPs 118, 122, 126, 130, 134, 138 may provide a securing of longitudinal sides of the load board. The tee clamps 150 may provide a securing from vertical movement of the load board. The mechanisms to secure of the respective components will be described in detail below.

As illustrated on the assembled frame 200 of FIG. 5, the tee clamps 150 may be attached at the locations where the screw holes 114 are disposed on the frame 100. As a result, because the screw holes 114 may be disposed toward an upper wall of the recess on the separator, the tee clamps 150 may also be disposed toward the upper wall of the recess on the separator. As illustrated, the tee clamps 150 may be adjacent to the upper side of the recess. However, it should be noted that a space may exist between the wall of the recess and the tee clamp 150. Furthermore, as illustrated, the edges of the clamp wings 164 may be flush with longitudinal edges of the loading site. However, it should be noted that the clamp wings 164 may extend slightly beyond the longitudinal edges of the loading site or may not extend all the way to the longitudinal edges of the loading site.

As described above, the extended portions of the screw body 156 that are located beyond the bottom edge of the clamp body 158 may provide the secure locking of the tee clamp 150 onto the frame 100. When the tee clamps 150 are properly oriented, the edges of the clamp wings 164 may run parallel to a longitudinal axis of the loading site (i.e., longitudinal axis of the frame 100). For example, the edges of the clamp wings 164 run parallel to the longitudinal axis of the loading site 102 or the longitudinal axis of the frame 100. Consequently, a tab recess may be created between a bottom side of the clamp wing 158 and a top side of the recess on each separator of the frame 100. The tab recess and its functionality will be described in further detail below, in particular with reference to FIG. 11.

Figure 6A:
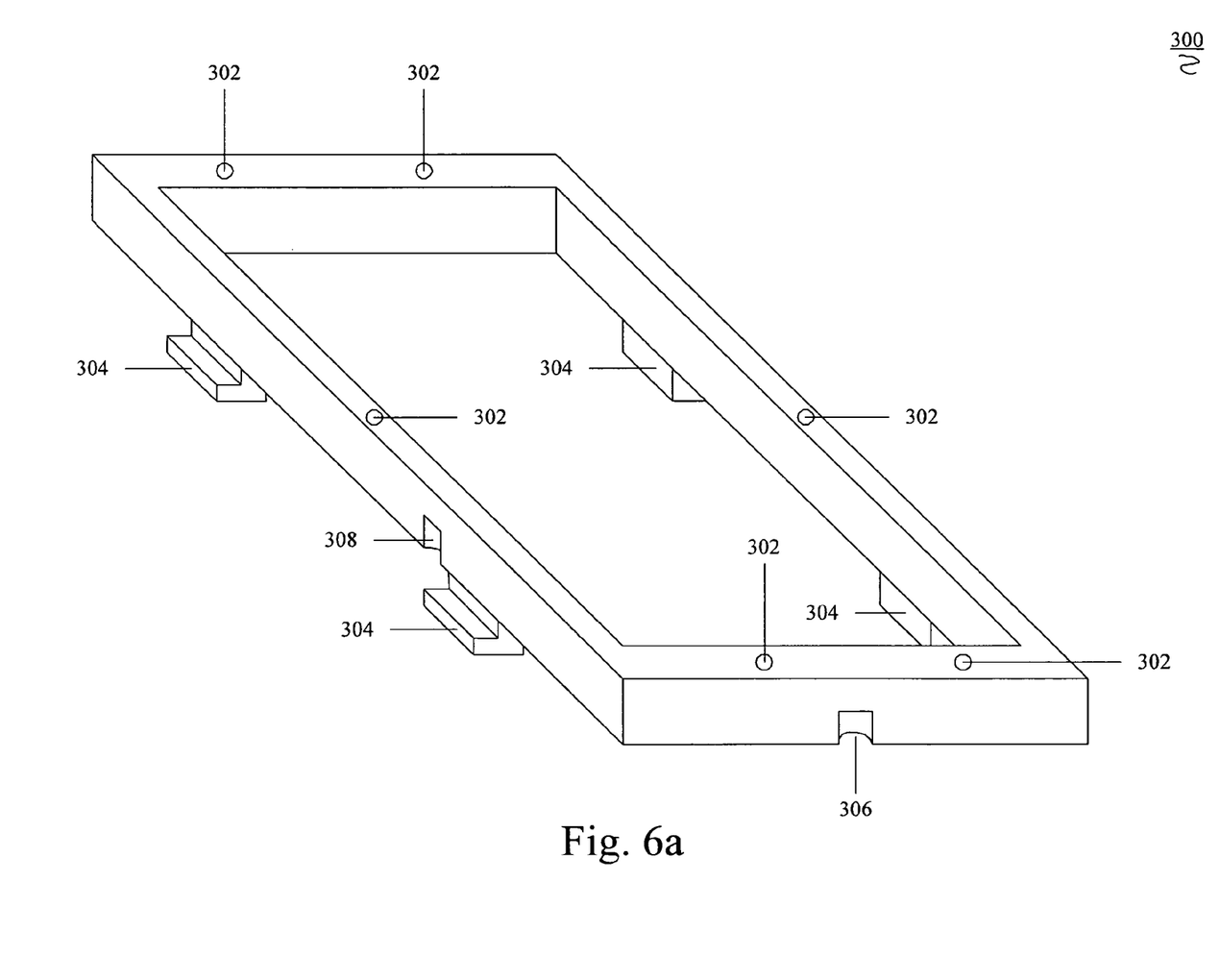
FIG. 6a shows a perspective view of a top side of a backer plate according to an exemplary embodiment of the present invention.

FIG. 6a shows a perspective view of a top side of a backer plate 300 according to an exemplary embodiment of the present invention. The backer plate 300 may be an intermediary used to attach a load board to the assembled frame 200. That is, a load board may be attached to a first side of the backer plate 300 and a second side may be used to affix the backer plate 300/load board assembly to the assembled frame 200. For example, a top side of the backer plate 300 may be used to attach the load board while a bottom side of the backer plate 300 may be used to affix the backer plate 300/load board assembly to the assembled frame 200. The backer plate 300 includes plate screw holes 302, lock tabs 304, an edge spring plunger insert (ESPI) 306, and side spring plunger inserts (SSPI) 308.

The plate screw holes 302 may provide a mechanism to attach the load board to the backer plate 300. As illustrated, screws from the load board may be inserted into the plate screw holes 302 in a substantially similar manner as described above with attaching the tee clamps 150 to the frame 100. The plate screw holes 302 are located on a top side of the backer plate 300. However, it should be noted that the plate screw holes 302 may be located on another side of the backer plate or multiple sides of the backer plate, thereby allowing the load board to be attached to the backer plate 300 in various locations. The plate screw holes 302 may be disposed in a variety of configurations. For example, as illustrated, two plate screw holes 302 may be disposed on each of the lateral sides of the backer plate 300. Furthermore, one plate screw hole 302 may be disposed on each of the longitudinal sides of the backer plate 300. However, it should be noted that this configuration is only exemplary and other dispositions of the plate screw holes 302 exist. For example, one plate screw hole 302 may be disposed on each of the sides of the backer plate 300. In another example, two plate screw holes 302 may be disposed on each of the longitudinal sides while plate screw hole 302 may be disposed on each of the lateral sides of the backer plate 300.

The lock tabs 304 may provide a mechanism to affix the backer plate 300 to the assembled frame 200. The lock tabs 304 may work in conjunction with the tab recesses created when the tee clamps 150 are attached to the frame 100. That is, the lock tabs 304 and the clamps 150 secure the assembly from vertical movement. The lock tabs 304 may be substantially L-shaped where a first leg of the L-shape allows the lock tab 304 to extend from a bottom side of the backer plate 300 and a second leg further extends toward an outer edge of the backer plate 300.

The lock tabs 304 may be integrated into the backer plate 300 as part of the overall housing. However, it should be noted that the lock tabs 304 may be separately attached to the backer plate 300. Thus, the lock tabs 304 may be attached at various locations, depending on the expected orientation with respect to the assembled frame 200. The lock tabs 304 may also be removable to facilitate other configurations with the assembled frame 200. As illustrated, the backer plate 300 includes four lock tabs 304 disposed substantially near a corner of the back side of the backer plate 300. As will be described in detail below, the length of the second leg of the lock tabs 304 may be less than or equal to a remaining length of the recess of the separator upon attaching the tee clamp 150. Furthermore, the length of the second leg of the lock tabs 304 may be less than or greater than the length of an outer edge of the clamp wing 164. That is, when the backer plate 300 is affixed to the assembled frame 200, the length of the second leg of the lock tabs 304 may be wholly within the tab recess, flush with the edges of the clamp wing 164, or extend beyond the tab recess.

The ESPI 306 and the SSPIs 308 may be recesses that contour to the shape of the ESP and the SSP, respectively. The ESPI 306 and the SSPIs 308 may be corresponding components that couple with one of the ESPs 116, 120, 124, 128, 132, 136 and two of the SSPs 118, 122, 126, 130, 134, 138, respectively. That is, when the backer plate 300 is properly affixed to the assembled frame 200, each ESP may couple with an ESPI while each SSP may couple with a SSPI. For example, if loading site 102 is utilized for an electronic test, the ESP 116 couples with the ESPI 306 while the SSP 118 couples with the SSPI 308. Those skilled in the art will understand that when multiple load boards (i.e., electronic devices) are tested (i.e., multiple loading sites are used), each load board may be assembled to a backer plate 300. Thus, each ESP and SSP may couple with a respective ESPI and SSPI.

Figure 6B:
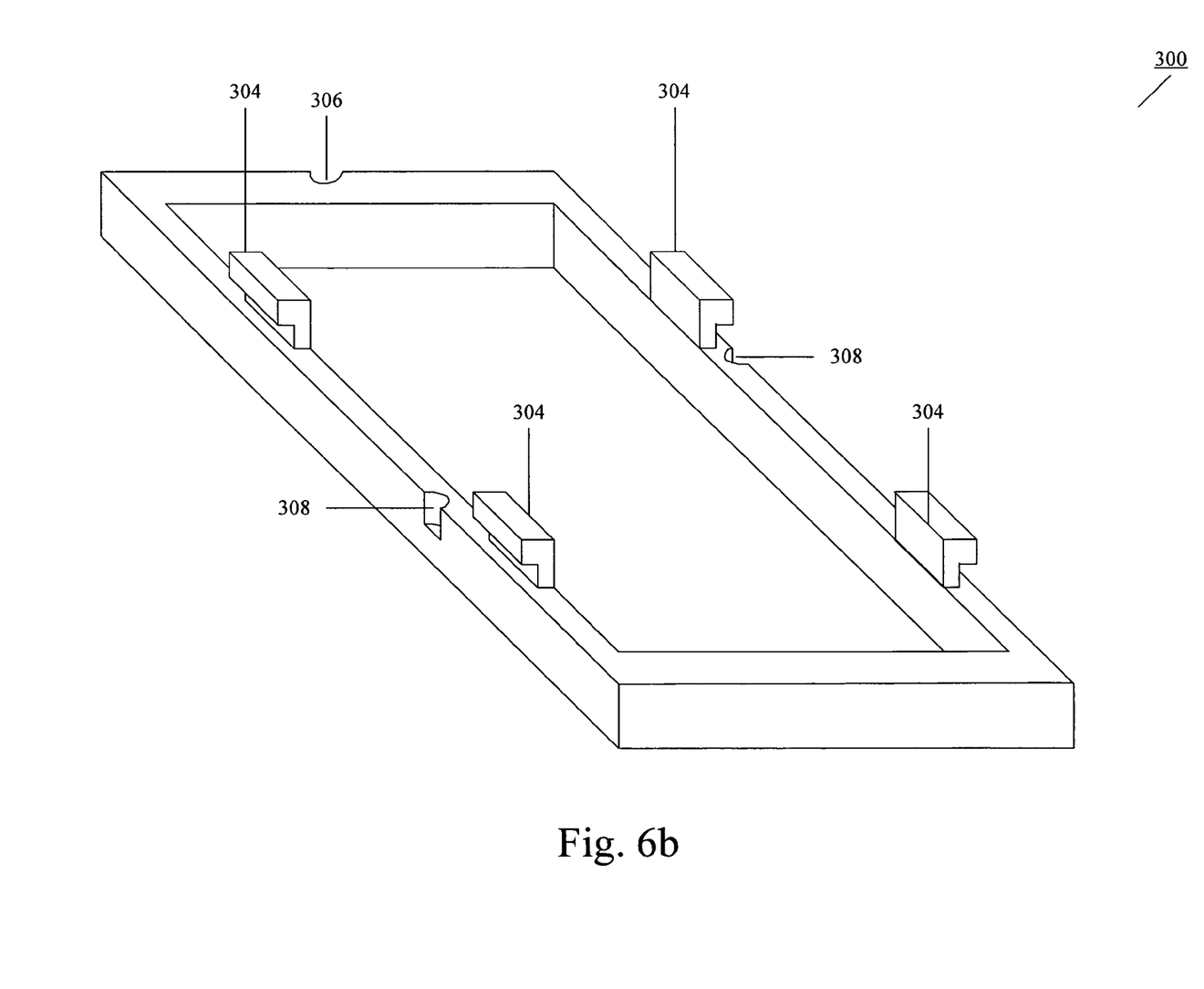

FIG. 6b shows a perspective view of a bottom side of the backer plate 300 of FIG. 6a. As illustrated in FIG. 6b, the ESPI 306 and the SSPIs 308 are visible. The ESPI 306 may be disposed on one of the lateral sides of the backer plate 300. The SSPIs 308 may be disposed on each of the longitudinal sides of the backer plate 300. Because the ESPI 306 couples with the ESP, the ESPI 306 may be disposed at a midpoint of the lateral side. However, similar to the ESP, the ESPI 306 may be disposed at various locations corresponding to the locations of the ESP of the loading site. In addition, because the SSPIs 308 couple with the SSPs, the SSPIs 308 may be disposed at a corresponding location of the SSPs. Thus, if additional SSPs are disposed on the assembled frame 200, additional SSPIs may be disposed on the backer plate 300. An additional ESP may also predicate additional ESPI on the backer plate 300.

The ESPI 306 and the SSPIs 308 may exhibit a semicircular shape. Therefore, the circular cross sectional shape of the ESP and the SSP may fit in the recesses formed by the ESPI 306 and the SSPIs 308, respectively. The coupling of the ESPI 306 and the SSPIs 308 with the ESPs and the SSPs, respectively, will be described in greater detail below with reference to FIGS. 10a-c. It should be noted that the location of the ESPI 306 and the SSPIs 308 on the edge of the backer plate 300 is only exemplary. For example, the ESPI 306 and the SSPIs 308 may be located wholly in the lateral and longitudinal sides of the backer plate 300, respectively. In such an embodiment, the ESPI 306 and the SSPIs 308 may be cylindrical recesses that receive the ESP and the SSPs, respectively. It should also be noted that the use of a circular cross sectional shape is only exemplary. For example, if the ESP and the SSPs may have a cross sectional shape that is square, rectangular, hexagonal, octagonal, etc. The ESPI 306 and the SSPIs 308 may have a corresponding shape. However, the ESPI 306 and the SSPIs 308 having a corresponding shape is only exemplary as well. The ESPI 306 and the SSPIs 308 may exhibit any shape that is capable of receiving the ESP and the SSPs, respectively. In addition, the ESP and the SSPs having similar shapes and the ESPI and the SSPIs having similar shapes is only exemplary. Those skilled in the art will understand that the ESP, the SSPs, the ESPI, and the SSPIs may exhibit any combination of shapes.

Figure 7:
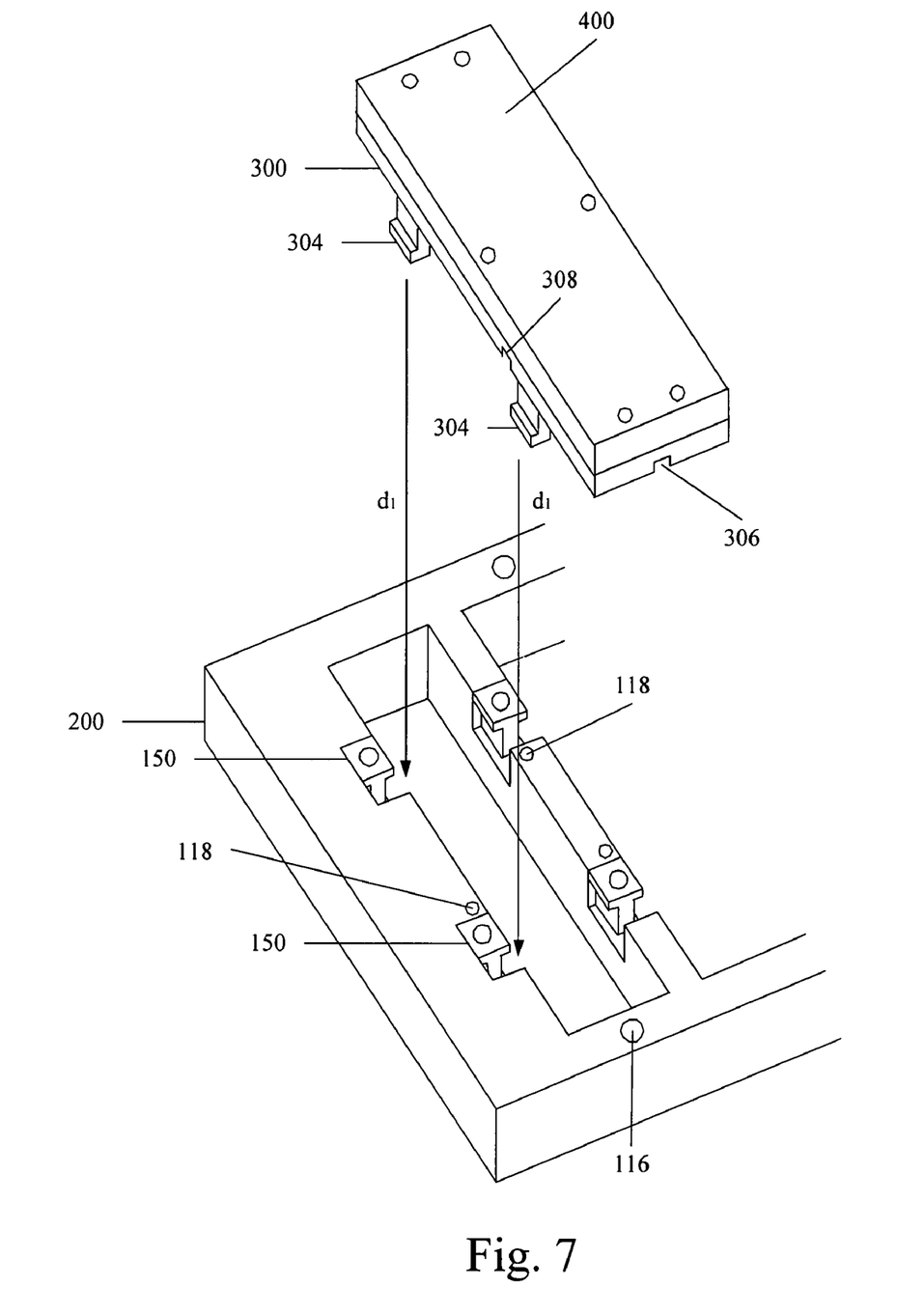

FIG. 7 shows a perspective view of a first exemplary step for coupling the assembled frame 200 of FIG. 5 with the backer plate 300 of FIG. 6a. The first exemplary step of completing the coupling process to securely fasten the backer plate 300 to the assembled frame 200 may involve moving the backer plate 300 in a direction $d_1$ towards the assembled frame 200. FIG. 7 further illustrates a load board 400 that has been attached to the backer plate 300.

Upon moving the backer plate 300 towards the assembled frame 200 in the direction $d_1$, the lock tabs 304 may be positioned in corresponding recesses of the separators on the assembled frame 200. Specifically, the lock tab 304 may be located in a remainder of the recess after the tee clamps 150 have been attached. As will be discussed in further detail below, the ESP 116 and both of the SSPs 118 may be depressed. Once the backer plate 300 has been moved, the longitudinal sides of the backer plate 300 may depress the SSPs 118 while the lateral side of the backer plate 300 may depress the ESP 116. Because the tee clamps 150 are positioned toward a top side, the remaining recesses are positioned toward a bottom side of the assembled frame 200. Therefore, the backer plate 300 may also be positioned toward a bottom side of the assembled frame 200 since the lock tabs 304 are inserted in the remaining recesses. Thus, the disposition of the ESP 116 allows a depression.

Figure 8:
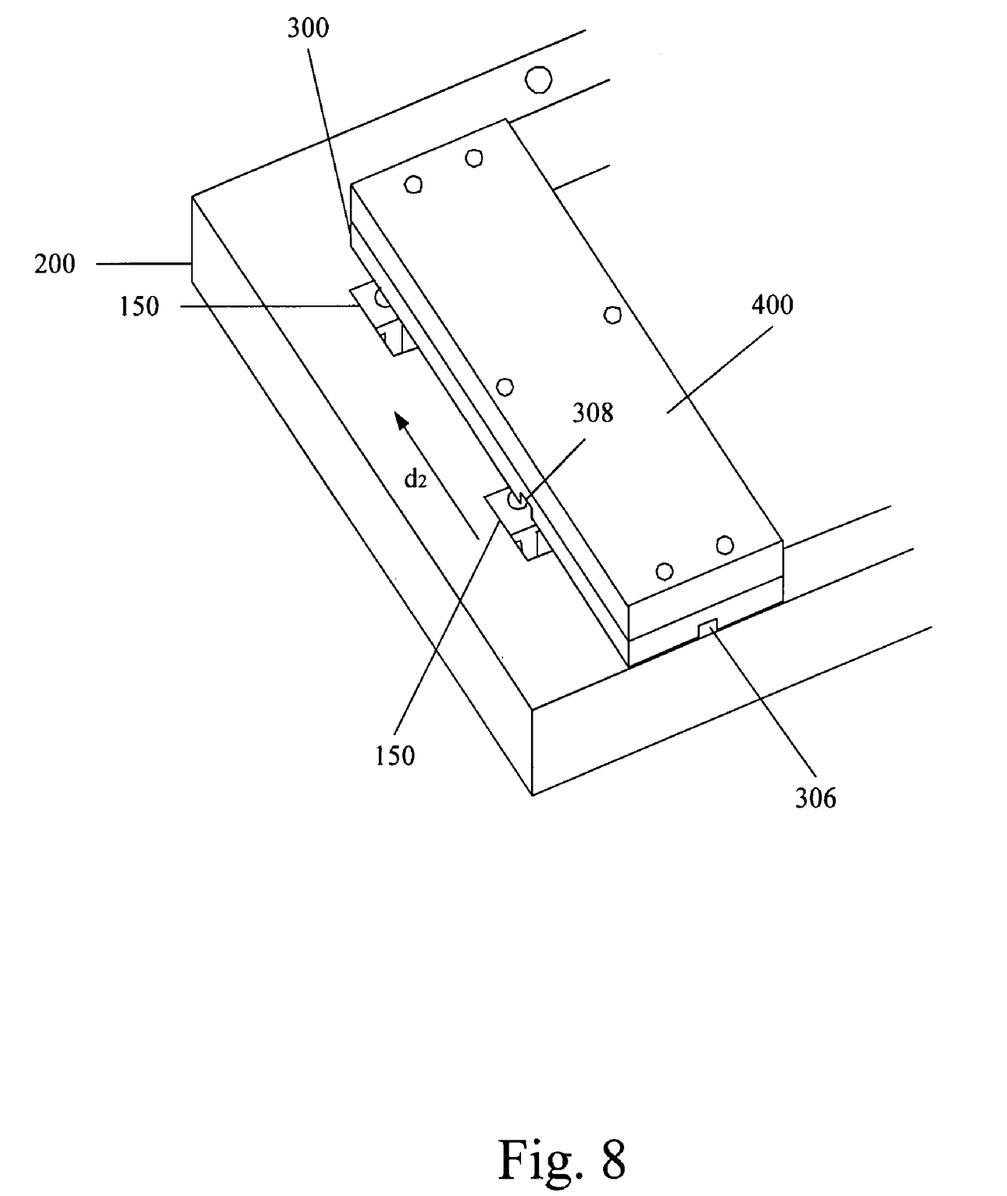

FIG. 8 shows a perspective view of a second exemplary step for coupling the assembled frame 200 of FIG. 5 with the backer plate 300 of FIG. 6a. The second exemplary step of completing the coupling process to securely fasten the backer plate 300 to the assembled frame 200 may involve moving the backer plate 300 in a direction $d_2$ along a top side of the assembled frame 200. FIG. 8 also illustrates the load board 400 that has been attached to the backer plate 300. The second exemplary step may represent a subsequent step after moving the backer plate 300 towards the assembled frame 200 in the direction $d_1$.

As described above, the backer plate 300 may be positioned atop the assembled frame 200 with the lock tabs 304 within the remaining recess of the separators. The ESP 116 and the SSPs 118 may be covered by the backer plate 300 and thereby depressed. Sliding the backer plate 300 in the direction $d_2$ allows the lock tabs 304 to enter the tab recess. Furthermore, the ESP 116 may extend from the depressed position into the recess of the ESPI 306 while the SSPs 118 may extend from the depressed position into the recesses of the SSPIs 308. If a top side ESP 116 is disposed on the assembled frame 200, the ESPI 306 on the top side of the backer plate 300 may couple with the top side ESP 116.

Figure 9:
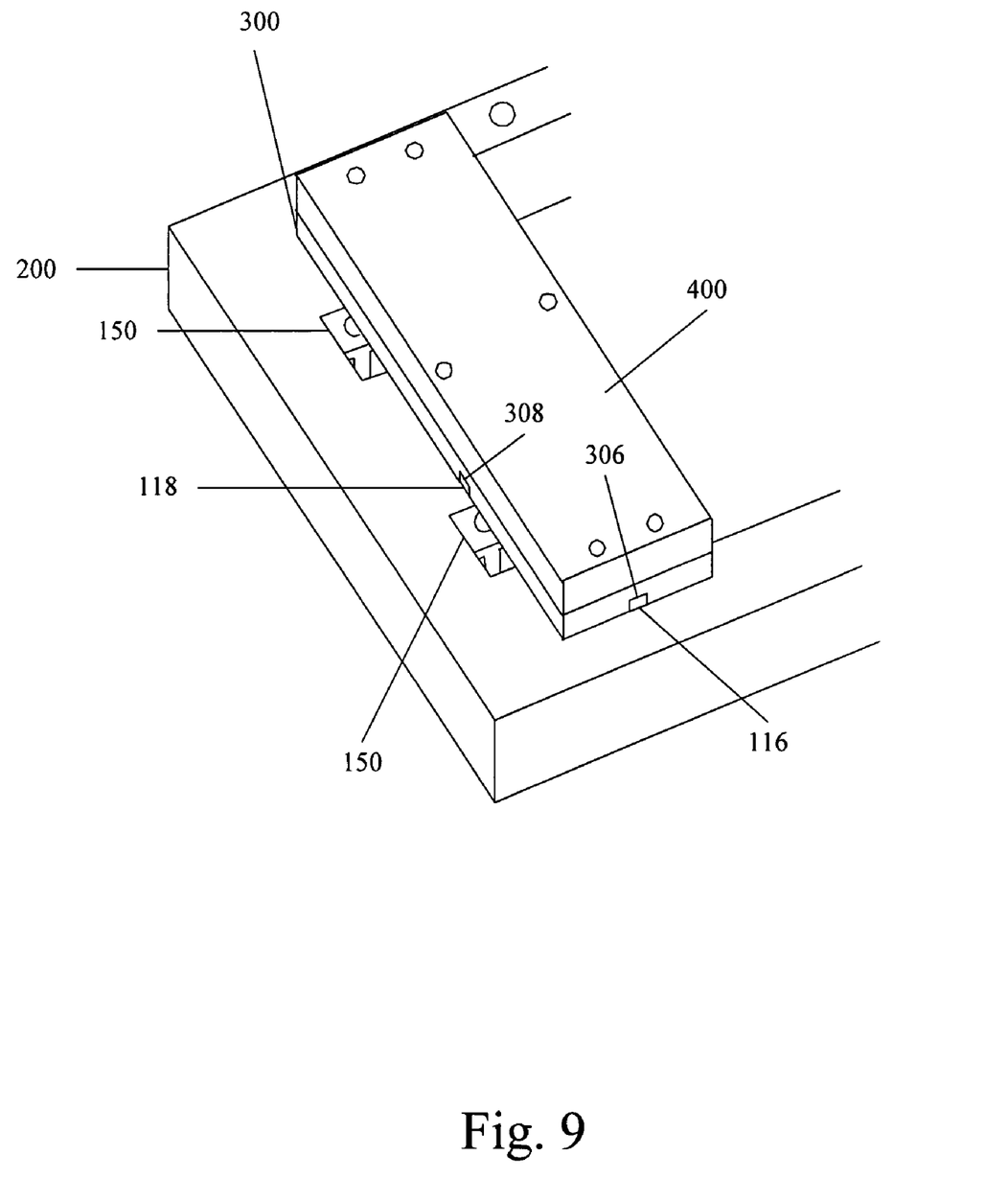

FIG. 9 shows a perspective view of the assembled frame 200 of FIG. 5 coupled to the backer plate 300 of FIG. 6a. That is, the backer plate 300 may have been moved first in the direction $d_1$ and then in the direction $d_2$. When the backer plate 300 is in an operative position, the lock tabs 304, the ESPs 116, and the SSPs 118 provide a secure affixation to the assembled frame 200. As discussed above, the lock tabs 304 may prevent an inadvertent movement of the load board 400 in a vertical direction. The ESP 116 and the SSPs 118 may prevent an inadvertent movement of the load board 400 in a planar direction (e.g., up, down, left, right). As illustrated, the lock tabs 304 may be securely fastened in the tab recesses; the ESP 116 may be securely fastened in the ESPI 306; and the SSPs 118 may be securely fastened in the SSPIs 308. The mechanism in which the ESP and SSPs is securely fastened will be described in detail below with reference to FIGS. 10a-c. The mechanism in which the lock tabs 304 is securely fastened will be described in detail below with reference to FIG. 11.

Figures 10A, 10B:
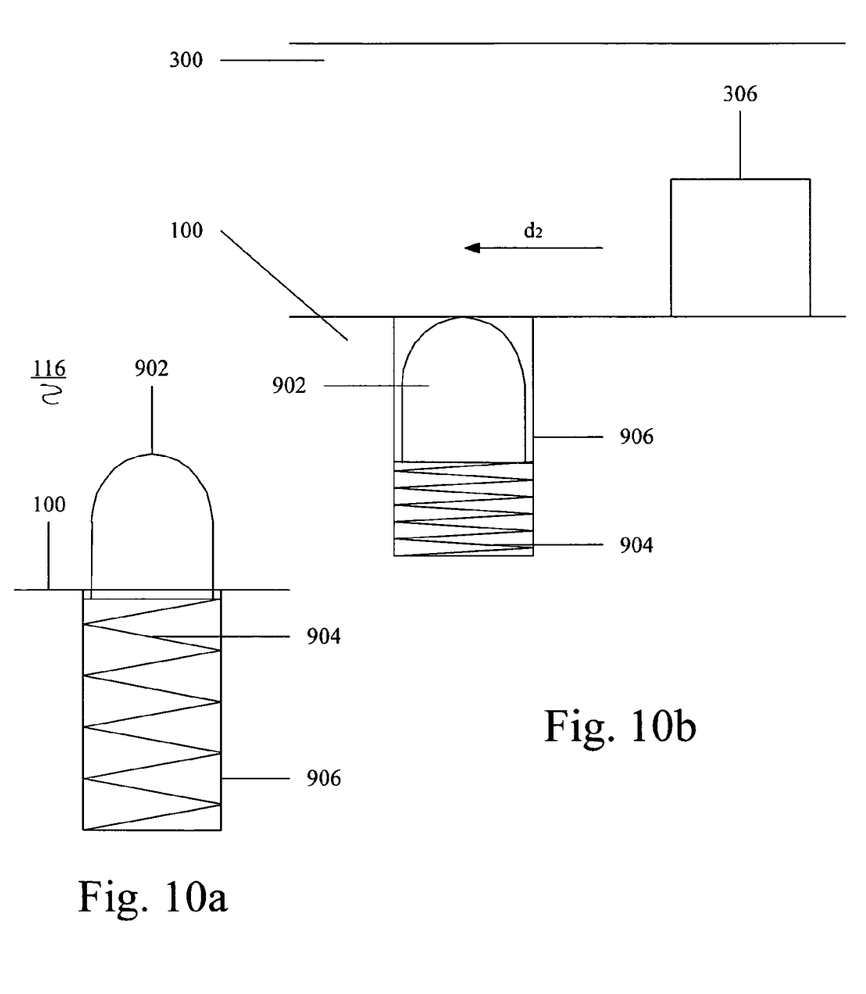
FIG. 10a shows an edge spring plunger of the spacer frame of FIG. 2 when not in use.
FIG. 10b shows the edge spring plunger of FIG. 10a when in use prior to being fully engaged.

FIG. 10a shows the ESP 116 of the spacer frame 100 of FIG. 2 when not in use. The mechanism in which the ESP 116 of FIG. 10a functions may also apply to the SSP. A difference between the ESP and the SSP may be in, for example, the cross-sectional size. However, the ESP and the SSP may function in substantially identical manners. The ESP 116 may be disposed as part of the spacer frame 100. The ESP 116 may include a plunger head 902, a plunger spring 904, and a plunger recess 906.

The plunger head 902 may be the portion of the ESP 116 that extends beyond the top side of the spacer frame 100. The plunger head 902 may include a cylindrical portion and a semi-spherical portion. However, as described above, the plunger head 902 may exhibit any shape including those described above. The plunger head 902 may also be the portion of the ESP 116 that couples to the ESPI 306. The plunger spring 904 may allow the ESP 116 to be depressed when the backer plate 300 has moved in the direction $d_1$. Because FIG. 10a illustrates the ESP 116 when not in use, the plunger spring 904 may be in a resting state (i.e., fully expanded). The plunger recess 906 serves to house the plunger spring 904 and the plunger head 902 when in a depressed state.

FIG. 10b shows the ESP 116 of FIG. 10a when in use prior to being fully engaged. The ESP 116 includes all the components described above with reference to FIG. 10a. Furthermore, FIG. 10b illustrates when the backer plate 300 has already been moved in the direction $d_1$. That is, the backer plate 300 may be resting atop the assembled frame 200. Consequently, the ESP 116 may be in a depressed state. As shown, the plunger head 902 may be housed completely within the plunger recess 906. When in the depressed state, the plunger spring 904 may be in a depressed state. FIG. 10b further illustrates that the backer plate 300 may be moved in the direction $d_2$, thereby positioning the ESPI 306 in a proper location.

Figure 10C:
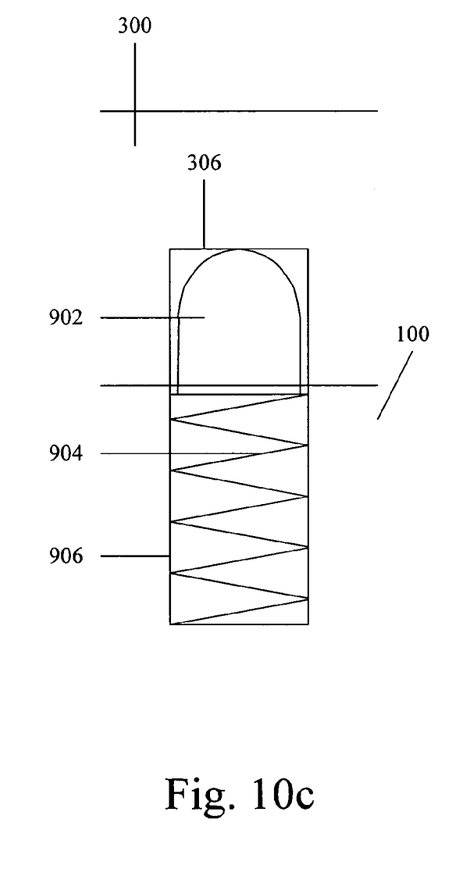
FIG. 10c shows the edge spring plunger of FIG. 10a when in use and upon being fully engaged.

FIG. 10c shows the ESP 116 of FIG. 10a when in use and upon being fully engaged. The ESP 116 and the backer plate 300 include all the components described above with reference to FIGS. 10a-b. FIG. 10c illustrates when the backer plate 300 has been moved in the directions $d_1$ and $d_2$. That is, FIG. 10c may be an enlarged view of the ESP 116 and the ESPI 306 shown in FIG. 8. When fully engaged, the plunger head 902 may be securely housed in the ESPI 306. The plunger spring 904 may have released from the depressed state shown in FIG. 10b to substantially the resting state shown in FIG. 10a. It should be noted that the height of the ESPI 306 being substantially equal to the height of the plunger head 902 is only exemplary. For example, the ESPI 306 may exhibit a height that is greater than or less than the plunger head 902. When the ESPI 306 exhibits a height greater than the plunger head 902, the plunger spring 904 may fully extend back to the resting state. Consequently, a small space may exist between the top edge of the ESPI 306 and the top of the plunger head 902. When the ESPI 306 exhibits a height less than the plunger head 902, the plunger spring 904 may extend allowed by the ESPI 306. Consequently, the top edge of the ESPI 306 may contact the top of the plunger head 902 and the plunger spring 906 may be in a semi-tense state (i.e., greater tension than the resting state of FIG. 10a but less tension than the tense state of FIG. 10b).

Figure 11:
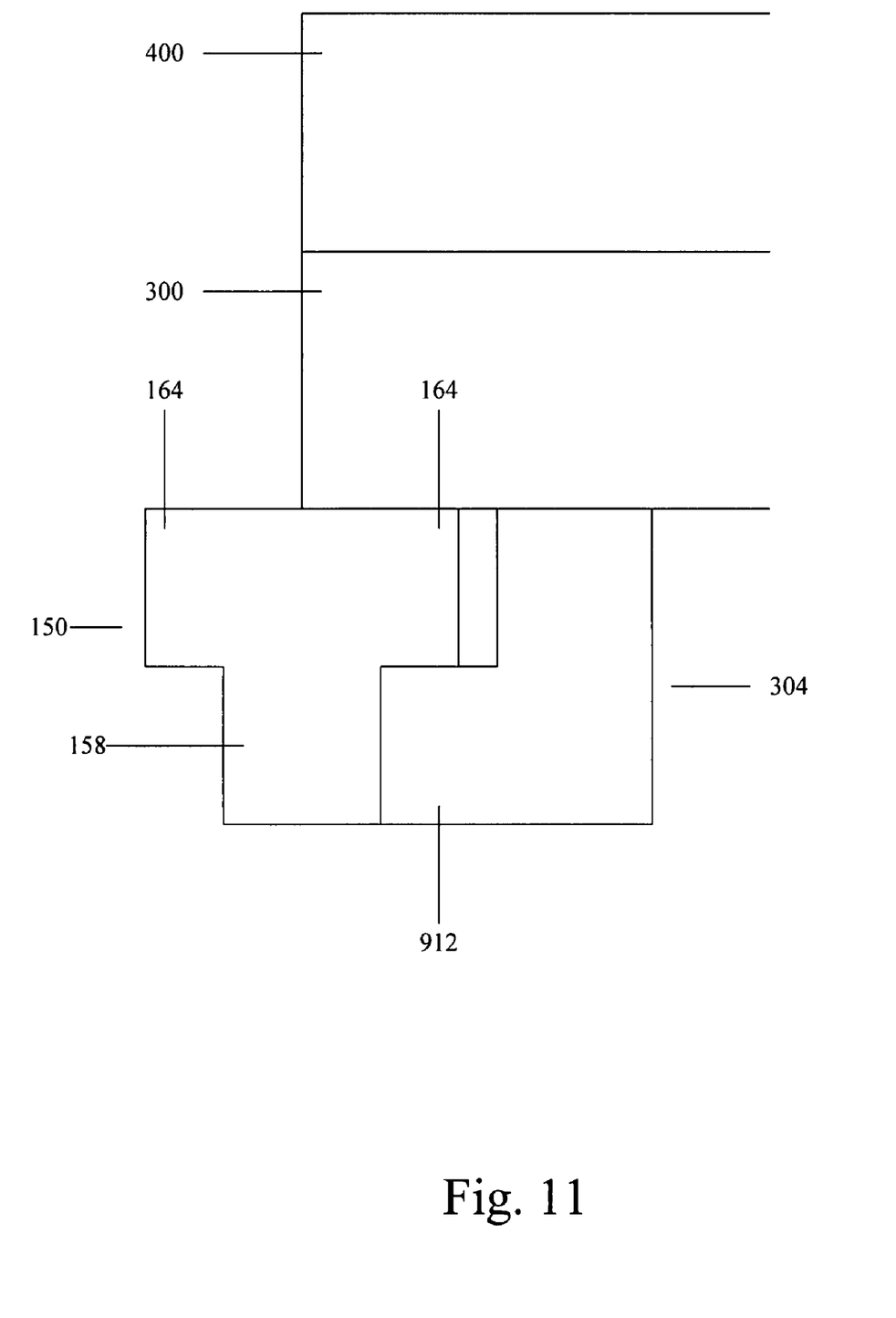

FIG. 11 shows the tee clamp 150 of FIG. 4b coupled to the lock tab 304 of the backer plate 300 of FIG. 6a. FIG. 11 may illustrate when the backer plate 300 has moved in the directions $d_1$ and $d_2$. As described above, when the backer plate 300 has moved in the directions $d_1$ and $d_2$, the lock tab 304 may be located in the tab recess (i.e., space created between the clamp wing 164 and the recess of the separator). The lock tab 304 may be substantially L-shaped with a lock tab leg 912. The lock tab leg 912 may be disposed in the tab recess. Through placement of the clamp wing 164 between the backer plate 300 and the lock tab leg 912, the load board 400, via the backer plate 300, may be securely affixed to the assembled frame 200.

It should be noted that the components of the slide and lock latching system may be modified in a variety of ways. For example, the tee clamps 150 may be slightly modified when located at loading sites 102, 112. Because the loading sites 102, 112 include a longitudinal edge that is not adjacent to another loading site, the tee clamps 150 placed in the recesses may be substantially L-shaped. That is, the tee clamp 150 may be modified to be half of the size of other tee clamps 150 with one clamp wing 164. Furthermore, the slide and lock latching system may include further components. For example, an insulating plate may be disposed between the backer plate 300 and the load board 400. The insulating plate may serve a variety of purposes such as providing a cushion layer, preventing an inadvertent transfer of heat and/or electricity, etc. In another example, the frame 100 may include a release lever. The release lever may be disposed at each location of the ESP and SSP. By activating the release lever, the ESP and SSP may return to a depressed state allowing a user to remove the backer plate 300.

It should also be noted that the use of screws as an attachment mechanism for the tee clamps 150 to the frame 100 and for the load board 400 to the backer plate 300 is only exemplary. Those skilled in the art will understand that the tee clamps 150 may be an integrated part of the frame 100. Furthermore, the tee clamps 150 may be attached to the frame 100 in a variety of other methods that do not require separate tools. For example, the tee clamps 150 may include a specialized shape that is inserted into a corresponding specialized hole. The load board 400 may be attached to the backer plate 300 in a variety of methods as well. For example, the backer plate 300 may be equipped with locking mechanisms such as arms, snaps, etc. that securely hold the load board 400.

Furthermore, it should be noted that the use of the backer plate 300 is only exemplary. For example, if the load board 400 includes substantially similar components as the backer plate 300 to couple with the frame 100, then the backer plate 300 may become unnecessary. Thus, in exemplary embodiments where the load board 400 includes lock tabs 304, the ESPI 306, and the SSPIs 308, the load board 400 may directly be engaged by the tee clamps, the ESP, and the SSPs, respectively, of the frame 100.

It will be apparent to those skilled in the art that various modifications may be made in the present invention, without departing from the spirit or scope of the invention. Thus, it is intended that the present invention cover the modifications and variations of this invention provided they come within the scope of the appended claims and their equivalents.

What is claimed is:

1. A system, comprising:
a frame including a loading site for a device under test, the loading site including a first tee clamp disposed along a first longitudinal axis and a second tee clamp disposed along a second longitudinal axis of the loading site, the loading site further including a first spring plunger disposed along a first lateral axis of the loading site; and
a backer plate configured to attach the device under test, the backer plate including two lock tabs coupling with the first and second tee clamps, the backer plate further including a first recess coupling with the first spring plunger.

2. The system of claim 1, wherein the frame includes a plurality of loading sites, each loading site receiving a different device under test.

3. The system of claim 1, wherein the loading site further includes a third tee clamp disposed along the first longitudinal axis and a fourth tee clamp disposed along the second longitudinal axes of the loading site.

4. The system of claim 3, wherein the first tee clamp is located a first distance from the third tee clamp and the second tee clamp is located a second distance from the fourth tee clamp.

5. The system of claim 4, wherein the first distance and the second distance are one of equal and different lengths.

6. The system of claim 3, wherein the backer plate further includes two additional lock tabs coupling with the third and fourth tee clamps.

7. The system of claim 1, wherein the loading site further includes a second spring plunger disposed along the first longitudinal axis and a third spring plunger disposed along the second longitudinal axis of the loading site.

8. The system of claim 7, wherein the backer plate further includes two additional recesses coupling with the second and third spring plungers.

9. The system of claim 1, wherein the loading site is manufactured with a first gap and a second gap in which the first and second tee clamps are affixed flush to a side of the first and second gaps.

10. The system of claim 9, wherein a length of the first and second gaps is greater than a length of the first and second tee clamps, resulting in a first space and a second space.

11. The system of claim 10, wherein the first and second spaces are configured to receive the first and second lock tabs.

12. The system of claim 11, wherein the first spring plunger is depressed by the backer plate when the first and second lock tabs are received.

13. The system of claim 12, wherein the first and second lock tabs slide under the first and second tee clamps upon being received in the first and second spaces and the first spring plunger returns to an original position, thereby locking the backer plate to the frame.

14. The system of claim 10, wherein the first and second spaces are disposed at a closer location to the first lateral axis than the first and second tee clamps.

15. A system, comprising:
an automatic test equipment electrically coupled to a device under test to perform an electronic test; and
a spacer frame for affixing the device tinder test, the spacer frame comprising:
a frame including a loading site for the device under test, the loading site including a first tee clamp disposed along a first longitudinal axis and a second tee clamp disposed along a second longitudinal axis of the loading site, the loading site further including a first spring plunger disposed along a first lateral axis and a second spring plunger disposed along a second lateral axis of the loading site; and
a backer plate configured to attach the device under test, the backer plate including two lock tabs coupling with the first and second tee clamps, the backer plate further including two recesses coupling with the first and second spring plungers.

16. The system of claim 15, further comprising:
a computer including a set of instructions for implementing the electronic test; and
a memory disposed in one of the computer, the automatic test equipment, and a combination thereof, the memory storing the set of instructions.

17. The system of claim 15, wherein the electronic test relates to conformation of the device under test to at least one of an industry standard and a manufacturer standard.

18. The system of claim 15, wherein the spacer frame is configured to affix more than one different device under test.

19. The system of claim 18, wherein the automatic test equipment performs the electronic test to each of the more than one different device under test.

20. A system, comprising:
a mounting means for attaching the device under test, the mounting means including a first lock tab disposed along a first longitudinal axis and a second lock tab disposed along a second longitudinal axis of the mounting means, the mounting means further including a recess disposed along a lateral axis of the mounting means; and
a framing means for receiving the mounting means, the framing means including two tee clamps coupling to the first and second lock tabs, the framing means further including a spring plunger coupling to the recess.

* * * * *

UNITED STATES PATENT AND TRADEMARK OFFICE
CERTIFICATE OF CORRECTION

PATENT NO. : 7,696,744 B2 Page 1 of 1
APPLICATION NO. : 11/998614
DATED : April 13, 2010
INVENTOR(S) : Todd James Sholl It is certified that error appears in the above-identified patent and that said Letters Patent is hereby corrected as shown below:

In the Claims, column 12, line 15, "device tinder test" should read --device under test--.

Signed and Sealed this

First Day of June, 2010

David J. Kappos
*Director of the United States Patent and Trademark Office*